US008775986B1

(12) United States Patent
Mohan et al.

(10) Patent No.: US 8,775,986 B1
(45) Date of Patent: Jul. 8, 2014

(54) SOFTWARE DEBUGGING OF SYNTHESIZED HARDWARE

(71) Applicant: Xilinx, Inc., San Jose, CA (US)

(72) Inventors: Sundararajarao Mohan, Sunnyvale, CA (US); L. James Hwang, Portola Valley, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/776,350

(22) Filed: Feb. 25, 2013

(51) Int. Cl.
*G06F 17/50* (2006.01)

(52) U.S. Cl.
USPC ........... 716/104; 716/106; 716/116; 716/117; 716/136

(58) Field of Classification Search
CPC .............. G01R 31/318314; G01R 31/318364; G06F 11/3656; G06F 17/505; G06F 17/5027; G06F 17/5054; G06F 2217/86
USPC ......... 716/100–104, 106–107, 116–117, 136, 716/138
See application file for complete search history.

(56) References Cited

U.S. PATENT DOCUMENTS

| 7,823,117 | B1 | 10/2010 | Bennett |
| 7,827,510 | B1 | 11/2010 | Schubert et al. |
| 2008/0313579 | A1* | 12/2008 | Larouche et al. ................. 716/3 |

\* cited by examiner

*Primary Examiner* — Paul Dinh
(74) *Attorney, Agent, or Firm* — LeRoy D. Maunu; Lois D. Cartier

(57) ABSTRACT

A method is provided for synthesizing an HLL program. For one or more variables to observe and/or control in a function of the HLL program, a first code segment is added to the function in the HLL program. For each of the one or more variables a respective second code segment is also added to the HLL program. In response to encountering the first code segment during synthesis of the HLL program, a memory is instantiated in a synthesized design. In response to encountering the second code segment during synthesis of the HLL program, a respective interface circuit is instantiated in the synthesized design. Each interface circuit is configured to replicate a state of the corresponding variable in the memory during operation of the synthesized design. A table is generated that maps names of the one or more variables to respective memory addresses in the memory.

16 Claims, 5 Drawing Sheets

SOFTWARE DEBUGGING OF SYNTHESIZED HARDWARE

TECHNICAL FIELD

The disclosure generally relates to the development, simulation, and debugging of circuit designs.

BACKGROUND

Programmable integrated circuits (ICs) may be programmed by a user to perform specified logic functions. One type of programmable IC, known as a field programmable gate array (FPGA), typically includes programmable resources that are arranged in an array of programmable tiles including, for example, input/output blocks (IOBs), configurable logic blocks (CLBs), dedicated random access memory blocks (BRAM), multipliers, digital signal processing blocks (DSPs), processors, clock managers, delay lock loops (DLLs), bus or network interfaces such as Peripheral Component Interconnect Express (PCIe) and Ethernet, and so forth.

Programmable ICs provide flexible hardware solutions that are advantageous for high performance parallel computing in advanced digital communications and video applications. For many complex applications, it may be desirable to implement a portion of the design in software (a program design) and a portion of the design in programmable resources. Many manufacturers, such as Xilinx, Inc., include embedded processor systems in a number of programmable ICs. These embedded processor systems may satisfy both the software and hardware needs of the application. Embedded processor systems often include operating memory, software instruction storage, input/output, and other components of a computer system. These systems are referred to as system-on-chip (SOC) solutions. With these systems, designers may implement a portion of the design in software and complex functions in programmable logic to increase efficiency and throughput. This architectural combination gives an advantageous mix of serial and parallel processing, flexibility, and scalability, thereby enhancing system partitioning.

Current SOC digital hardware design is done using hardware description languages (HDLs) such as Verilog and VHDL. These languages provide special constructs to handle the description of digital hardware-specific entities such as registers and clocks. While these languages are effective in describing hardware circuits, they provide little in the way of high-level abstractions to manage the complexity of modern designs. In contrast, modern software languages, and in particular object-oriented high-level languages (HLL) such as Java and C++ provide robust high-level constructs that are very effective at managing complexity and serve to improve designer productivity as well as design quality. Synthesizing compilers have been created to infer and synthesize hardware circuits from an HLL design. The ability to describe circuits using an HLL allows a designer to focus on the algorithms, rather than the implementation details.

During the process of developing a circuit design, the behavior of an implemented system is generally simulated based on a specification of the circuit design. Simulating the system helps to verify correct behavior prior to physical implementation and deployment. Wasted manufacturing costs due to faulty design may thereby be avoided.

Circuits synthesized from an HLL design may be simulated in a simulation environment alongside other circuits described in an HDL and/or along with simulation of a program to be executed on a processor of the programmable IC.

In debugging an HLL design, it may be desirable to debug a hardware portion of the design while it is implemented in hardware (e.g. using programmable resources of a programmable IC). For instance, for synthesized circuits to be deployed using programmable resources of a programmable IC, it may be desirable to verify behavior of the circuit when implemented in the target hardware instead of using a model of the hardware. Furthermore, debugging in hardware may be performed at much faster speeds than simulation and debugging using a model.

It can be difficult to debug hardware from a software debugging tool. One technique to debug hardware from a software tool is to provide explicit memory-mapped access to various internal registers (e.g., control and/or status) included in the hardware by bringing signals to a module's interface. Using this technique, changes to a set of variables that are to be monitored in an HLL function require calls to the function to be changed as well (either in the software test bench or in an accompanying hardware test bench). Configuration of an interface to provide memory-mapped access to internal registers of hardware generated through HLL synthesis tools requires knowledge about hardware design techniques. Moreover, such configuration is a lengthy manual process, which may present a substantial barrier for a software designer.

SUMMARY

A method is provided for synthesizing an HLL program. Using a programmed processor, in response to user input indicating one or more variables to observe and/or control in a function of the HLL program, a first code segment is added to the function in the HLL program. In further response to the user input, a respective second code segment is added to the HLL program for each of the one or more variables to observe and/or control. Using the programmed processor, a synthesized design is generated from the HLL program. In response to encountering the first code segment during synthesis, a memory is instantiated in the synthesized design. In response to encountering the second code segment during synthesis, a respective interface circuit is instantiated in the synthesized design. Each interface circuit is configured to replicate in the memory a state of the corresponding variable during operation of a circuit implemented from the synthesized design. A mapping table is generated that maps names of the one or more variables to respective memory addresses in the memory where respective states of the one or more variables are to be replicated by the interface circuit.

A system for debugging an HLL program is also provided. The system includes a programmable IC having a set of programmable resources and a microprocessor circuit. The system also includes a computing platform coupled to the programmable IC. The computing platform is programmed to implement a software debug-configuration tool. The software debug-configuration tool is configured to, in response to user input indicating one or more variables to observe/control in a function of the HLL program, add a first code segment to the function in the HLL program. The software debug-configuration tool is further configured to add a respective second code segment to the HLL program for each of the one or more variables. The software debug-configuration tool is further configured to synthesize a synthesized design from the HLL program. In synthesis of the synthesized design, the HLL program is traversed. In response to encountering the first code segment in the traversal, a memory is instantiated in the synthesized design. In response to encountering the second code segment in the traversal, a respective interface circuit is instantiated in the synthesized design. Each interface circuit is configured to replicate in the memory a state of the corresponding variable during operation of a circuit implemented from the synthesized design.

An integrated circuit (IC) is also is provided. The IC includes a set of programmable resources specially programmed to implement, a logic circuit having one or more registers to be observed and a memory. For each of the one or more registers, the set of programmable resources are also configured to implement a respective interface circuit. Each interface circuit is configured to replicate a state of the corresponding register at a respective address in the memory during operation of the logic circuit, and the IC also includes a programmed processor coupled to the set of programmable resources. The programmed processor is configured to read the replicated states of the one or more registers from the corresponding addresses in the memory and output the replicated states of the one or more registers from the IC.

Other embodiments will be recognized from consideration of the Detailed Description and Claims, which follow.

BRIEF DESCRIPTION OF THE DRAWINGS

Various aspects and advantages of the disclosed examples will become apparent upon review of the following detailed description and upon reference to the drawings, in which.

DETAILED DESCRIPTION

Methods and circuits are disclosed for debugging of hardware synthesized from an HLL design. In some examples, interface circuits are added to a synthesized HLL design. The added interface circuits are configured to provide signal values from the synthesized hardware (e.g., implemented in programmable resources of a programmable IC) to a software debugging tool running on a computing platform (e.g., connected to the programmable IC). A mechanism is described for adding such interface circuits to an HLL design without manual configuration by a developer. For instance, developers who are not familiar with hardware design and debugging may add control/observation markers to the HLL design, indicating variables that are to be observed and/or controlled during debugging. Preconfigured HLL code is automatically added to the HLL design to implement interface circuits necessary to observe and/or control the marked variables during operation of the synthesized hardware.

Figure 1:
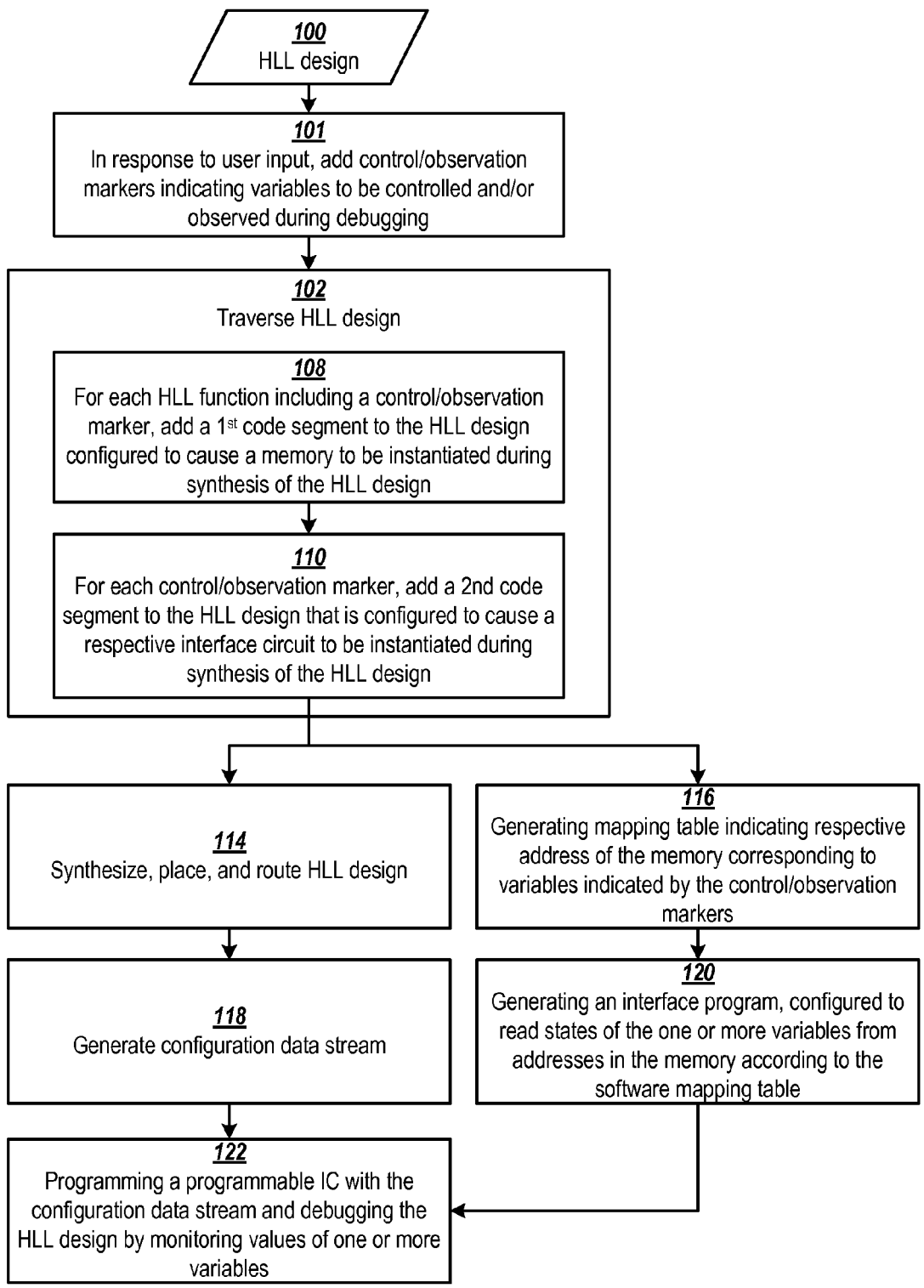
FIG. 1 shows a process of configuring an HLL design to facilitate debugging during operation of the synthesized design.

FIG. 1 shows a process of configuring an HLL design to facilitate debugging during operation of the synthesized design. Control markers and/or observation markers are added to an HLL design 100 at block 101 in response to user input. The control/observation markers indicate variables of the HLL design that are desired to be controlled and/or observed during debugging. Example 1 shows an example HLL function (hw_function) that is to be synthesized into hardware. In this example, a first macro XD_OBSERVE(a) (shown in bold) is added to indicate that variable a is to be observed during debugging. Similarly, a second macro CONTROL_OBSERVE(x) (shown in bold) is added to indicate that variable x is to be observed and controlled during debugging. In some alternative implementations, pragmas or function calls can be used instead of macros to serve as control/observation markers indicating variables that are to be controlled/observed. In some other alternative implementations, directives may be defined in a separate file.

```
int hw_function(int a, int b[100], int c[100]) {
#pragma AP RESOURCE variable=b core=SPRAMD
XD_OBSERVE(a); // observation marker (macro or function)
for (int i=0; I<a; i++) {
    c[i]=b[i]+10;
}
for (int j=a+1; j<100; j++) {
x=j−a;
XD_CONTROL_OBSERVE(x); // control marker (macro or function)
y=c[x];
c[j]=y*y;
}
}
```

EXAMPLE 1

After control/observation markers are added, the HLL design 100 is traversed at block 102. For each HLL function encountered in the traversal that includes a control/observation marker, a first code segment is added to the HLL design at block 108. The first code segment is configured to cause a synthesis compiler to instantiate a respective memory during synthesis of the HLL design. For instance, referring again to the HLL function shown in Example 1, in one implementation the following code segment is added to the HLL function:

pragma AP RESOURCE variable=debug_bram core=SPRAMD;

The code segment causes a memory (e.g., BRAM) to be instantiated for the HLL function during synthesis.

For each control/observation marker encountered in the traversal, a second code segment is added to the HLL design at block 110. The second code is configured to cause the synthesis compiler to instantiate a respective interface circuit during synthesis of the HLL design. For instance, referring again to the HLL function shown in Example 1, in one implementation, the XD_OBSERVE(a) macro is replaced with the code segment:

debug_bram[Address_of_a]=a;

This code segment maps the variable to a unique address in the memory instantiated for the HLL function (i.e., debug_bram). When the HLL function is synthesized, the code segment causes instantiation of a circuit that updates the memory address in the BRAM with the value of the variable a. Similarly, for a variable indicated by a control marker, the following code segment maps the variable x to a unique address in the instantiated memory:

X=debug_bram[Address_of_x];

When the HLL function is synthesized, the code segment causes instantiation of a circuit that adjusts a register value in the synthesized hardware (corresponding to the variable x), to have a value indicated at the corresponding address in the instantiated memory. The HLL design is synthesized, placed, and routed at block 114.

A mapping table is generated at block 116 to indicate addresses in the instantiated memory (i.e., debug_bram) that correspond to the variables in the HLL design indicated by control/observation markers. In different implementations, the mapping table may have different data formats including, for example, DWARF, STAB, COFF, PECOFF, OMF, IEEE695. At block 120, an interface program is generated that is configured to allow a software debugging tool to read and write states of the variables from the corresponding addresses in the instantiated memory according to the generated mapping table.

A configuration data stream is generated at block 118. The configuration data stream is configured to program programmable resources of a programmable IC to implement the synthesized, placed, and routed HLL design. At block 122, programmable resources of the programmable IC are programmed with the configuration data stream and the processor of the programmable IC is programmed to implement the interface program. In the implementation shown in FIG. 1, the interface program used to program the processor is separate from the configuration data stream used to program the programmable resources. However, for some programmable ICs, the processor may be programmed via the configuration data stream. For instance, a soft core processor may be implemented using the programmable resources and programmed via the configuration data stream to execute the interface program. In such implementations, the interface program is included in the configuration data stream generated at block 118. Other methods may also be used to program the processor of the programmable IC to execute the interface program.

During debugging of the synthesized HLL hardware as implemented in the programmable resources of a programmable IC, the interface program is executed on a processor of the programmable IC or a separate processor. The interface program is configured to communicate the states of the observed variables from the instantiated memory to a software debugging tool. The interface program is also configured to communicate the states of the controlled variables from the software debugging tool to the instantiated memory. In some implementations, the program clocks the synthesized HLL function in order to start/stop the hardware under control of the software debugging tool. This allows the software debugging tool to a breakpoint-like/single step debugging capability to a user.

Figure 2:
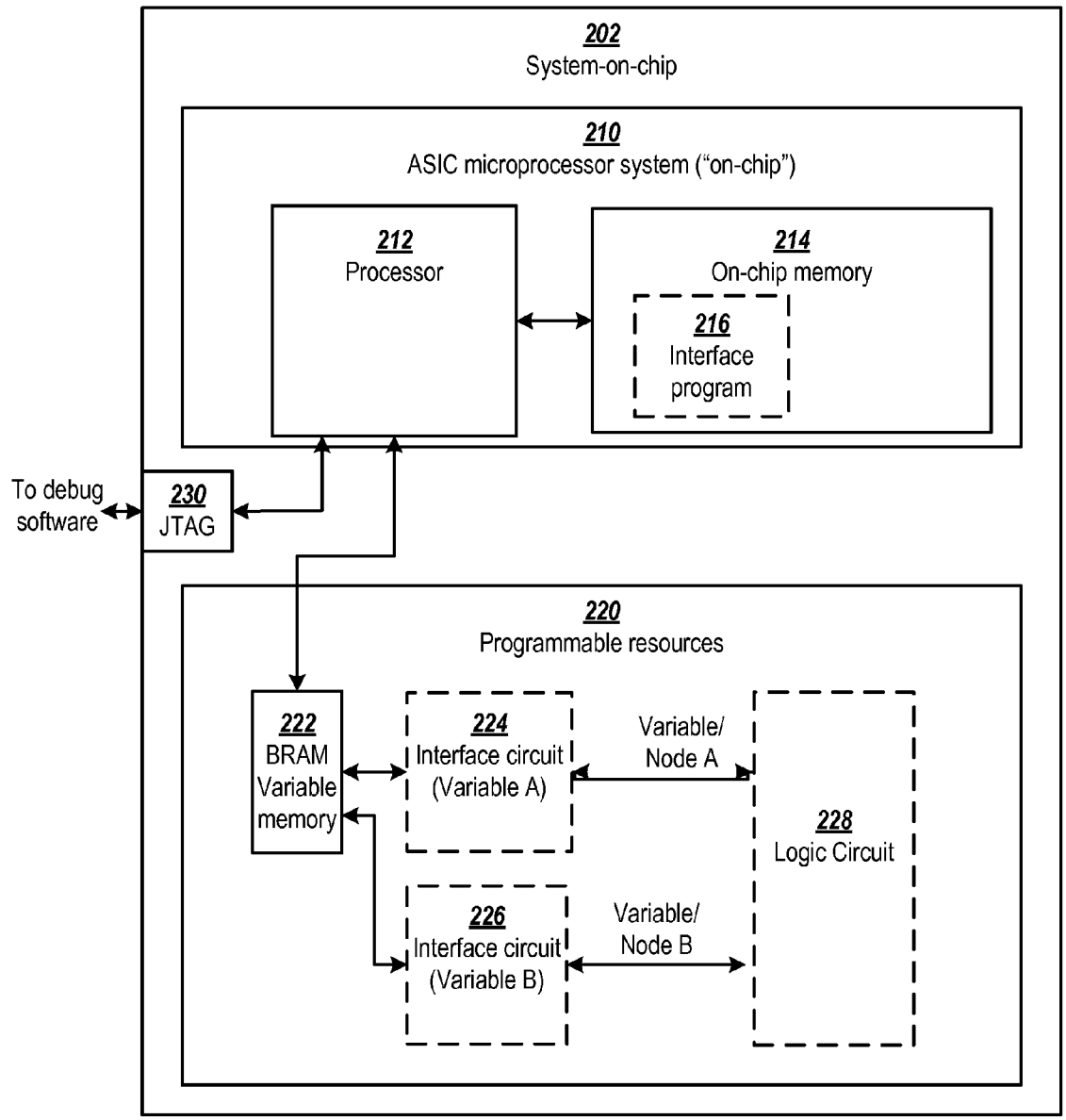
FIG. 2 shows a first configuration of a SOC to store values of monitored variables in memory and provide a standard interface to communicate values between the memory and a debugging software environment.

The interface circuits, memory, and program may be configured differently in different implementations to provide the above described functionality. For example, FIG. 2 shows a first configuration of a SOC to store values of monitored variables in memory and provide a standard interface to communicate values between the memory and a software debugging tool. The SOC 202 includes programmable resources 220 and a microprocessor circuit 210 including a processor 212 and memory 214. The programmable resources 220 may be configured to, e.g., implement a synthesized portion of an HLL design when deployed. The microprocessor circuit may be configured to execute a software portion of an HLL design when deployed. In this example, the microprocessor circuit 210 is a hardwired circuit in the programmable IC. Such hardwired circuits are sometimes referred to application specific ICs (ASICs). However, in some implementations the microprocessor circuit 210 may be implemented using programmable resources of the programmable IC.

In the configuration shown in FIG. 2, programmable resources of the SOC are configured to implement a synthesized portion of an HLL design that is to be debugged. Programmable resources are also configured to implement interface circuits 224 and 226 that are configured to facilitate debugging of respective variables (Variables A and B).

Consistent with the process described with reference to FIG. 1, an interface circuit (224 or 226) corresponding to a variable to be observed is configured to update a respective memory location in memory 222 with a value of a corresponding register of the synthesized hardware circuit 228. For variables to be controlled, the interface circuit corresponding to a variable to be controlled is configured to update a register in the synthesized hardware circuit 228 (corresponding to the controlled variable) with a value indicated in a respective memory location in memory 222.

In the configuration shown in FIG. 2, the processor 212 is configured to execute an interface program 216 stored in on-chip memory 214. The interface program is configured to provide an interface allowing a debugging tool to read values of monitored variables from the memory 222 and write values of variables to be controlled to the memory 222. In different implementations, data may be communicated between the software debugging tool and the interface program 216 using a number of different protocols and/or communication interfaces. For instance, in some implementations, the interface program 216 is configured to process read and write requests received from a software debugging tool via a communication interface (e.g., JTAG interface 230). In some implementations, communication of data between the software debugging tool and the interface program 216 may be initiated by the interface program. Although data is primarily described as being communicated between the software debugging tool and the interface program 216 using a JTAG interface 230, different implementations may use other communication interfaces for communication including, e.g., PCIe and Ethernet.

Figure 3:
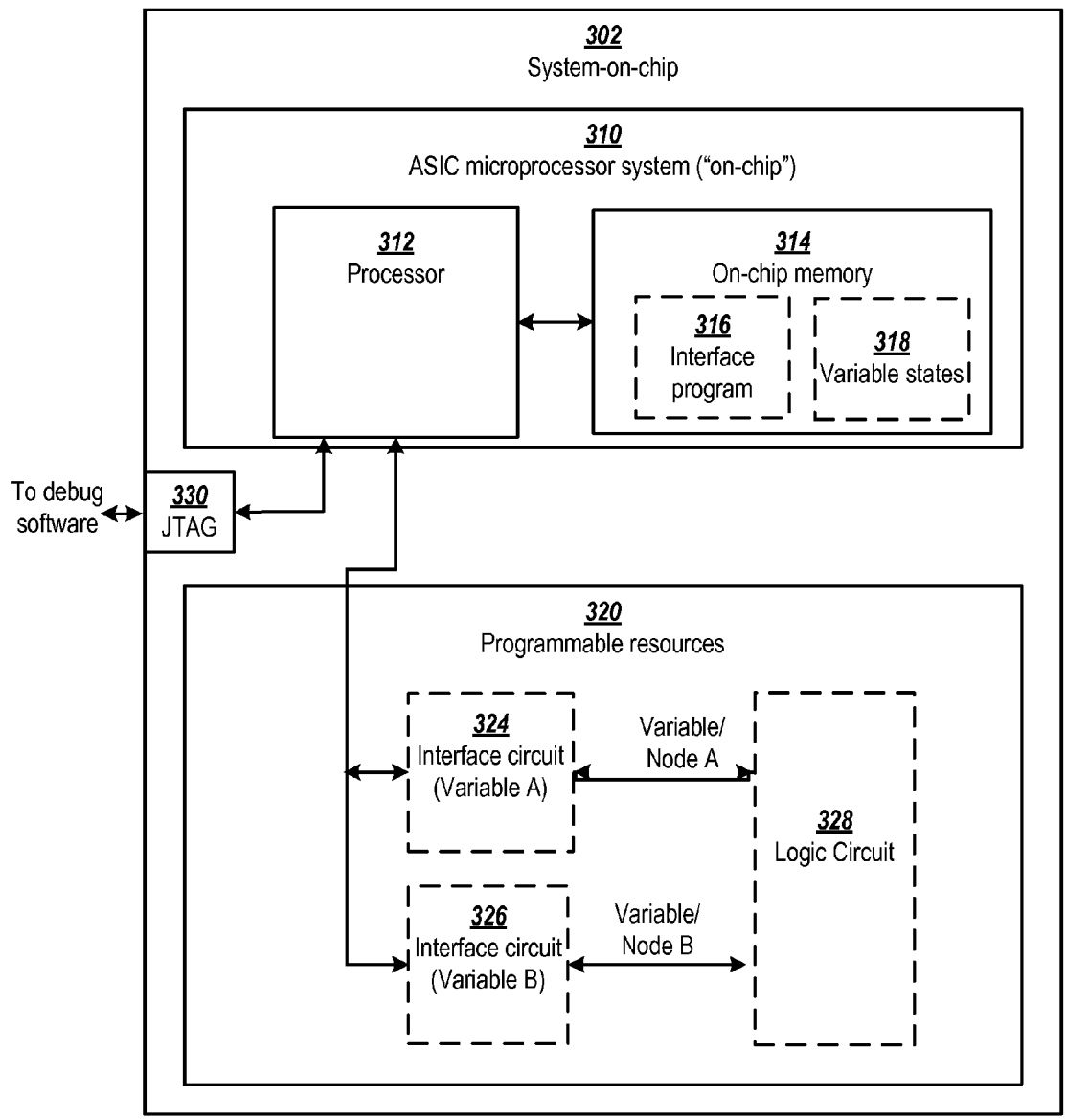
FIG. 3 shows a second configuration of a SOC to store values of monitored variables in on-chip memory and provide a standard interface to communicate values between the memory and a debugging software environment.

FIG. 3 shows a second configuration of a SOC to store values of monitored variables in on-chip memory and provide a standard interface to communicate values between the memory and a debugging software environment. As described with reference to the SOC 202 shown in FIG. 2, the SOC 302 includes programmable resources 320 and a microprocessor circuit 310 including a processor 312 and memory 314. In this example, the memory is memory 314 integrated with the processor 312 in the microprocessor circuit 310 (i.e., contained in the same IC chip). However, in some implementations, the memory 314 and processor 312 may be implemented on separate IC chips. In the configuration shown in FIG. 3, programmable resources 320 of the SOC are configured to implement a synthesized portion of an HLL design that is to be debugged. Programmable resources 320 are also configured to implement interface circuits 324 and 326 that are configured to facilitate debugging of respective variables (Variables A and B). Each interface circuit is configured to provide updated states of a monitored variable to interface program 316 that is executed by processor 312.

In this configuration, observed and controlled variables are mapped to a reserved portion 318 of the on-chip memory 314. An interface circuit (324 or 326) corresponding to a variable to be observed is configured to update a respective memory location in the reserved portion 318 via an interface program 316 executed on processor 312. Conversely, an interface circuit (324 or 326) corresponding to a variable to be controlled is configured to receive updated values of the variable from the reserved portion 318 via an interface program 316, and update a register in the synthesized hardware circuit 328 (corresponding to the controlled variable) with the received value. In some implementations, communication of data between the reserved portion 318 of the on-chip memory 314 may be initiated by the interface program 316. In some other implementations, the interface program 316 is configured to read and write data to the reserved portion 318 of the on-chip memory 314 in response to read and write requests issued from the interface circuits (324 or 326). As described with reference to interface program 216 in FIG. 2, the interface program 316 is configured to provide an interface allowing a debugging tool to read values of monitored variables from the memory 314 and write values of variables to be controlled to the memory 314 (e.g., via JTAG interface 330).

In the examples described with reference to FIGS. 2 and 3, data values of observed and controlled variables are buffered in mapped memory locations (e.g., 222 and 318). However, the embodiments are not so limited. In some implementations, the interface program (e.g., 316) executing on the processor 312 is configured to receive values corresponding to observed variables directly from interface circuits (e.g., 324 and 326) and communicate the received values directly to a software debugging tool via JTAG interface 330 and without buffering the values in memory mapped locations. Conversely, in some implementations, the interface program (e.g., 316) is configured to receive values corresponding to control variables from the software debugging tool and communicate the received values directly to the corresponding interface circuits (e.g., 324 and 326) without buffering the values in memory mapped locations.

Figure 4:
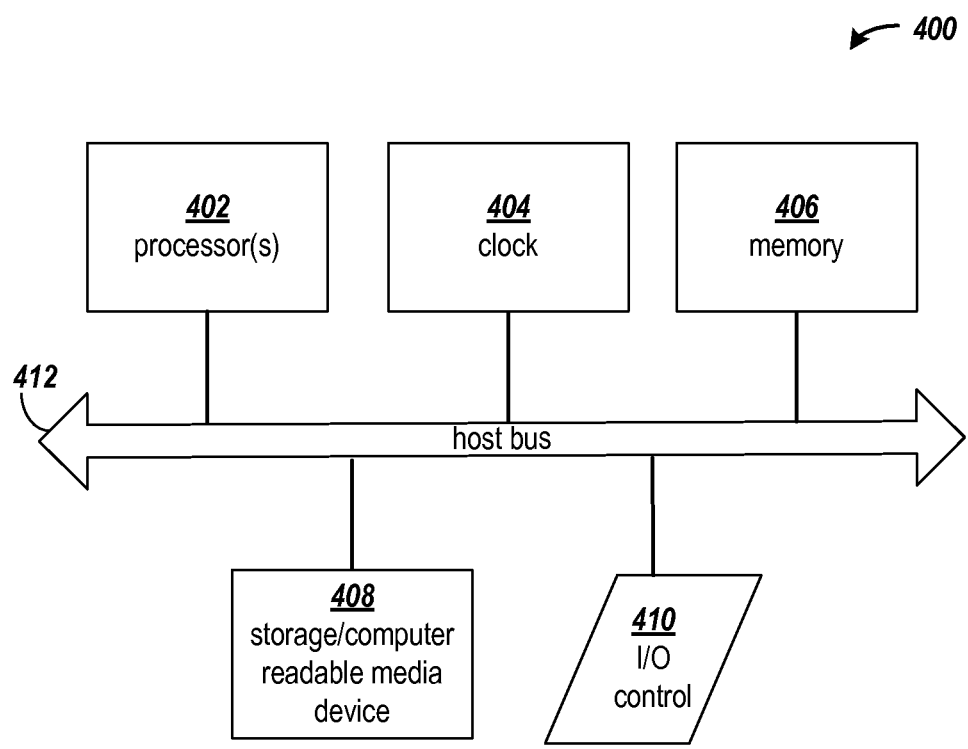
FIG. 4 shows a block diagram of an example computing arrangement that may be configured to implement various processes described herein.

FIG. 4 shows a block diagram of an example computing arrangement that may be configured to implement various processes described herein. It will be appreciated that various alternative computing arrangements, including one or more processors and a memory arrangement configured with program code, would be suitable for hosting the disclosed processes and data structures. The computer code, which implements the disclosed processes, is encoded in a processor executable format and may be stored and provided via a variety of computer-readable storage media or delivery channels such as magnetic or optical disks or tapes, electronic storage devices, or as application services over a network.

Processor computing arrangement 400 includes one or more processors 402, a clock signal generator 404, a memory arrangement 406, a storage arrangement 408, and an input/output control unit 410, all coupled to a host bus 412. The arrangement 400 may be implemented with separate components on a circuit board or may be implemented internally within an integrated circuit.

The architecture of the computing arrangement depends on implementation requirements, as would be recognized by those skilled in the art. The processor(s) 402 may be one or more general-purpose processors, or a combination of one or more general-purpose processors and suitable co-processors, or one or more specialized processors (e.g., RISC, CISC, pipelined.), for example.

The memory arrangement 406 typically includes multiple levels of cache memory, and a main memory. The storage arrangement 408 may include local and/or remote persistent storage, such as provided by magnetic disks (not shown), flash, EPROM, or other non-volatile data storage. The storage unit may be read or read/write capable. Further, the memory arrangement 406 and storage arrangement 408 may be combined in a single arrangement.

The processor(s) 402 executes the software in storage arrangement 408 and/or memory arrangement 406, reads data from and stores data to the storage arrangement 408 and/or memory arrangement 406, and communicates with external devices through the input/output control arrangement 410. These functions are synchronized by the clock signal generator 404. The resource of the computing arrangement may be managed by either an operating system (not shown), or a hardware control unit (not shown).

Those skilled in the art will appreciate that various alternative computing arrangements, including one or more processors and a memory arrangement configured with program code, would be suitable for hosting the processes and data structures disclosed herein.

Figure 5:
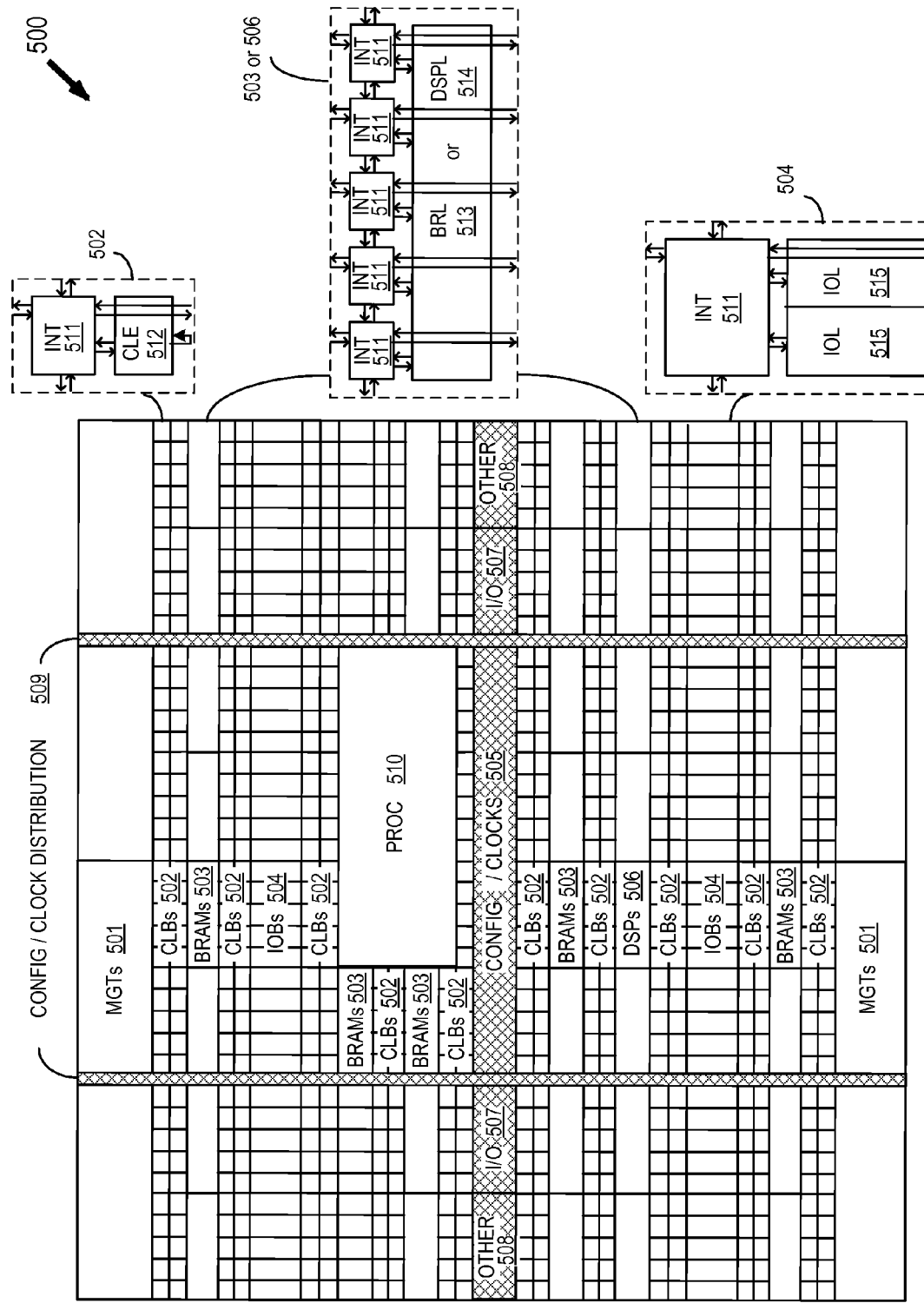
FIG. 5 is a block diagram of an example programmable IC that may be used for debugging a synthesized HLL design.

FIG. 5 is a block diagram of an example programmable IC that may be used for debugging a synthesized HLL design in accordance with various implementations. The programmable IC shown in FIG. 5 is an FPGA. FPGAs can include several different types of programmable logic blocks in the array. For example, FIG. 5 illustrates an FPGA architecture (500) that includes a large number of different programmable tiles including multi-gigabit transceivers (MGTs 501), configurable logic blocks (CLBs 502), random access memory blocks (BRAMs 503), input/output blocks (IOBs 504), configuration and clocking logic (CONFIG/CLOCKS 505), digital signal processing blocks (DSPs 506), specialized input/output blocks (I/O 507), for example, e.g., clock ports, and other programmable logic 508 such as digital clock managers, analog-to-digital converters, system monitoring logic, and so forth. Some FPGAs also include dedicated processor blocks (PROC 510) and internal and external reconfiguration ports (not shown).

In some FPGAs, each programmable tile includes a programmable interconnect element (INT 511) having standardized connections to and from a corresponding interconnect element in each adjacent tile. Therefore, the programmable interconnect elements taken together implement the programmable interconnect structure for the illustrated FPGA. The programmable interconnect element INT 511 also includes the connections to and from the programmable logic element within the same tile, as shown by the examples included at the top of FIG. 5.

For example, a CLB 502 can include a configurable logic element CLE 512 that can be programmed to implement user logic plus a single programmable interconnect element INT 511. A BRAM 503 can include a BRAM logic element (BRL 513) in addition to one or more programmable interconnect elements. Typically, the number of interconnect elements included in a tile depends on the width of the tile. In the pictured FPGA, a BRAM tile has the same width as five CLBs, but other numbers (e.g., four) can also be used. A DSP tile 506 can include a DSP logic element (DSPL 514) in addition to an appropriate number of programmable interconnect elements. An IOB 504 can include, for example, two instances of an input/output logic element (IOL 515) in addition to one instance of the programmable interconnect element INT 511. As will be clear to those of skill in the art, the actual I/O pads connected, for example, to the I/O logic element 515 are manufactured using metal layered above the various illustrated logic blocks, and typically are not confined to the area of the input/output logic element 515.

In the pictured FPGA, a horizontal area near the center of the die (shown shaded in FIG. 5) is used for configuration, clock, and other control logic. Vertical areas 509 extending from this horizontal area are used to distribute the clocks and configuration signals across the breadth of the FPGA.

Some FPGAs utilizing the architecture illustrated in FIG. 5 include additional logic blocks that disrupt the regular row structure making up a large part of the FPGA. The additional logic blocks can be programmable blocks and/or dedicated logic. For example, the processor block PROC 510 shown in FIG. 5 spans several rows of CLBs and BRAMs.

Note that FIG. 5 is intended to illustrate only an exemplary FPGA architecture. The numbers of logic blocks in a row, the relative heights of the rows, the number and order of rows, the types of logic blocks included in the rows, the relative sizes of the logic blocks, and the interconnect/logic implementations included at the top of FIG. 5 are purely exemplary. For example, in an actual FPGA more than one adjacent row of CLBs is typically included wherever the CLBs appear, to facilitate the efficient implementation of user logic.

The examples described herein are thought to be applicable to a variety of systems for co-simulation and debugging. Other aspects and embodiments will be apparent to those skilled in the art from consideration of the specification. For instance, although examples may in some cases be described in individual figures, it will be appreciated that features from one figure can be combined with features of another figure even though the combination is not explicitly shown or explicitly described as a combination. The examples may be implemented as one or more processors configured to execute software, as an application specific integrated circuit (ASIC), or as a logic on a programmable logic device. It is intended that the specification and illustrated structures and methods be considered as examples only, with a true scope of the invention being indicated by the following claims.

What is claimed is:

1. A method for synthesizing a high-level language (HLL) program, comprising:
    on a programmed processor, performing operations including:
        in response to user input indicating one or more variables to observe in a function of the HLL program:
            adding a first code segment to the function in the HLL program; and
            for each of the one or more variables to observe, adding a respective second code segment to the HLL program; and
        generating a synthesized design from the HLL program, including:
            in response to encountering the first code segment during synthesis, instantiating a memory in the synthesized design;
            in response to encountering the second code segment during synthesis, instantiating a respective interface circuit in the synthesized design;
            wherein each interface circuit is configured to replicate in the memory a state of a corresponding variable during operation of a circuit implemented from the synthesized design; and
            generating a table that maps names of the one or more variables to respective memory addresses in the memory where respective states of the one or more variables are to be replicated by the interface circuit.

2. The method of claim 1, further comprising:
    generating a program, executable on a processor of a programmable IC, configured to read states of the one or more variables from addresses in the memory according to the table and output the states of the one or more variables from the programmable IC.

3. The method of claim 2, further comprising:
    debugging the synthesized design using a software debugging tool; and
    during the debugging:
        using the program to retrieve values of one or more variables; and
        displaying the retrieved values.

4. The method of claim 2, further comprising
    placing and routing the synthesized design;
    generating a configuration data stream from the placed and routed synthesized design;
    configuring programmable resources of the programmable IC with the configuration data stream;
    operating the circuit configured on the programmable IC with the configuration data stream; and
    executing the program on the processor of the programmable IC.

5. The method of claim 2, wherein the processor on the programmable IC is hardwired in the programmable IC.

6. The method of claim 2, wherein the processor on the programmable IC is implemented in programmable resources of the programmable IC.

7. The method of claim 1, further comprising, during operation of the circuit implemented from the synthesized design and in response to the programmable IC receiving a command from a debugging tool connected to the programmable IC to set a select variable of the one or more variables to a new state, setting a node in the synthesized design associated with the select variable to the new state using the corresponding interface circuit.

8. The method of claim 1, wherein the memory comprises a block random access memory (BRAM) included in a programmable IC.

9. The method of claim 1, wherein the memory is integrated in a processor included in a programmable IC.

10. A system for debugging a high-level language (HLL) program, comprising:
    a programmable IC including a set of programmable resources and a microprocessor circuit; and
    a software debug-configuration tool on a computing platform, wherein the software debug-configuration tool is configured to:
        in response to user input indicating one or more variables to observe in a function of the HLL program:
            add a first code segment to the function in the HLL program; and
            for each of the one or more variables to observe, add a respective second code segment to the HLL program; and
        generate a synthesized design from the HLL program by performing operations including:
            traversing the HLL program,
            in response to encountering the first code segment in the HLL program, instantiate a memory in the synthesized design; and
            in response to encountering the second code segment in the HLL program, instantiate a respective interface circuit in the synthesized design,
            wherein each interface circuit is configured to replicate in the memory a state of a corresponding variable during operation of a circuit implemented from the synthesized design.

11. The system of claim 10, wherein the software debug-configuration tool is further configured to:
    generate a table that maps names of the one or more variables to respective memory addresses in the memory where respective states of the one or more variables are to be replicated by the interface circuit;
    generate an interface program, executable on a processor of a programmable IC, configured to read states of the one or more variables from addresses in the memory according to the table and output the states of the one or more variables from the programmable IC; and configure the set of programmable resources to implement the synthesized design and the processor to execute the interface program.

12. The system of claim 11, wherein the software debug-configuration tool is further configured to:
   place and route the synthesized design;
   generate a configuration data stream from the placed and routed synthesized design; and
   use the configuration data stream to perform the configuring of the programmable resources of the programmable IC to implement the synthesized design.

13. The system of claim 11, further comprising a software debugging tool on the computing platform, the software debugging tool configured to:
   debug the synthesized design; and
   during the debugging:
      use the interface program to retrieve values of one or more variables; and
      display the retrieved values.

14. The system of claim 13, wherein the interface program is configured to, in response to receiving a read request from the software debugging tool indicating a select one of the one or more variables, communicate the state of the selected one of the one or more variables from the programmable IC.

15. The system of claim 13, wherein during the debugging the software debugging tool is further configured to, for at least one of the one or more variables, use the interface program and the interface circuit corresponding to the at least one variable to change the value of a register in the synthesized design corresponding to the at least one variable.

16. The system of claim 15, wherein the interface program is configured to, in response to receiving a write request indicating the memory address corresponding to the at least one variable, change the values of the at least one variable in the corresponding address of the memory.

* * * * *